(12) United States Patent
Hurwitz

(10) Patent No.: US 10,574,216 B2
(45) Date of Patent: Feb. 25, 2020

(54) METHOD AND APPARATUS FOR GENERATING HIGH CURRENT, FAST RISE TIME STEP-FUNCTIONS

(71) Applicant: THE UNIVERSITY OF NORTH CAROLINA AT CHARLOTTE, Charlotte, NC (US)

(72) Inventor: Elisa Nicole Hurwitz, Charlotte, NC (US)

(73) Assignee: The University of North Carolina at Charlotte, Charlotte, NC (US)

(*) Notice: Subject to any disclaimer, the term of this patent is extended or adjusted under 35 U.S.C. 154(b) by 0 days.

(21) Appl. No.: 15/739,550

(22) PCT Filed: Jun. 24, 2016

(86) PCT No.: PCT/US2016/039272
§ 371 (c)(1),
(2) Date: Dec. 22, 2017

(87) PCT Pub. No.: WO2016/210276
PCT Pub. Date: Dec. 29, 2016

(65) Prior Publication Data
US 2018/0175836 A1 Jun. 21, 2018

Related U.S. Application Data

(60) Provisional application No. 62/184,050, filed on Jun. 24, 2015.

(51) Int. Cl.
*H03K 4/02* (2006.01)
*H03K 5/12* (2006.01)
(Continued)

(52) U.S. Cl.
CPC ............ *H03K 4/023* (2013.01); *H03K 5/12* (2013.01); *H03K 5/1252* (2013.01); *H03K 2005/00013* (2013.01)

(58) Field of Classification Search
CPC ............ H03K 4/023; H03K 3/57; H03K 3/12; H03K 2005/00013
See application file for complete search history.

(56) References Cited

U.S. PATENT DOCUMENTS 4,627,063 A * 12/1986 Hosokawa ............ H05B 41/30
372/25
4,900,990 A * 2/1990 Sikora .................... H05B 41/32
315/241 P
(Continued)

FOREIGN PATENT DOCUMENTS

WO 2017/197269 A1 11/2017

OTHER PUBLICATIONS

International Search Report for PCT/US2016/039272, dated Sep. 16, 2016, 3 pages.
(Continued)

*Primary Examiner* — Thomas J. Hiltunen
(74) *Attorney, Agent, or Firm* — Nixon & Vanderhye, P.C.

(57) ABSTRACT

Method and apparatus to produce a step function with a designed transition (rise and/or fall) time on the order of <10 ns that reaches steady state by implementing a system that sums a number of currents at different rise times (frequencies) to generate the step function. The system also includes a passive output filter, composed of low resistance, inductance and very low capacitance to mitigate overshoot and high frequency noise.

18 Claims, 9 Drawing Sheets

(51) Int. Cl.
*H03K 5/1252* (2006.01)
*H03K 5/00* (2006.01)

(56) References Cited

U.S. PATENT DOCUMENTS

| | | | | |
|---|---|---|---|---|
| 5,264,895 A * | 11/1993 | Takahashi | ............. | G03B 15/05 |
| | | | | 315/240 |
| 5,420,781 A | 5/1995 | Schmidt | | |
| 5,689,520 A * | 11/1997 | Hoang | ............. | A61B 18/20 |
| | | | | 372/25 |
| 5,754,011 A * | 5/1998 | Frus | ............. | F02P 3/0869 |
| | | | | 315/209 SC |
| 5,883,471 A * | 3/1999 | Rodman | ............. | H03K 3/53 |
| | | | | 315/200 A |
| 5,963,439 A * | 10/1999 | Wuidart | ............. | H02J 1/10 |
| | | | | 361/111 |
| 6,366,076 B1 | 4/2002 | Karrer et al. | | |
| 6,391,667 B1 * | 5/2002 | Hashimoto | ............. | H02M 3/07 |
| | | | | 327/379 |
| 6,847,670 B1 * | 1/2005 | Kakizaki | ............. | H01S 3/0971 |
| | | | | 372/38.02 |
| 6,862,307 B2 * | 3/2005 | Osmanow | ............. | H01S 3/225 |
| | | | | 372/38.03 |
| 7,859,080 B2 * | 12/2010 | Kuwajima | ............. | H01G 4/33 |
| | | | | 257/275 |
| 7,903,700 B2 * | 3/2011 | Nagai | ............. | H01S 3/134 |
| | | | | 372/20 |
| 8,010,010 B2 * | 8/2011 | Kishi | ............. | G03G 15/2039 |
| | | | | 219/470 |
| 8,054,058 B2 * | 11/2011 | Liu | ............. | H02M 3/1588 |
| | | | | 323/284 |
| 8,427,182 B2 * | 4/2013 | Amanuma | ............. | G01R 31/2839 |
| | | | | 307/115 |
| 8,659,360 B2 * | 2/2014 | Helio | ............. | H03L 7/06 |
| | | | | 327/3 |
| 9,331,677 B2 * | 5/2016 | Parikh | ............. | H03K 3/0315 |
| 9,455,589 B2 * | 9/2016 | Kubota | ............. | H02J 7/007 |
| 9,702,942 B2 * | 7/2017 | Katoh | ............. | G01R 31/40 |
| 10,012,063 B2 * | 7/2018 | Storslett | ............. | E21B 28/00 |
| 10,027,120 B1 * | 7/2018 | Zapata | ............. | H02J 3/01 |
| 2001/0039649 A1 | 11/2001 | Boggs et al. | | |
| 2002/0180465 A1 | 12/2002 | Novak | | |
| 2005/0057274 A1 | 3/2005 | Groen et al. | | |
| 2005/0156599 A1 | 7/2005 | Panzer | | |
| 2014/0008073 A1 * | 1/2014 | Rey-Bethbeder | ............. | E21B 36/04 |
| | | | | 166/308.1 |
| 2014/0159717 A1 | 6/2014 | Paci et al. | | |
| 2019/0080884 A1 * | 3/2019 | Ziemba | ............. | H03K 3/57 |

OTHER PUBLICATIONS

Written Opinion of the ISA for PCT/US2016/039272, dated Sep. 16, 2016, 10 pages.

\* cited by examiner

METHOD AND APPARATUS FOR GENERATING HIGH CURRENT, FAST RISE TIME STEP-FUNCTIONS

CROSS-REFERENCE TO RELATED APPLICATIONS

This application is the U.S. national phase of International Application No. PCT/US2016/039272 filed Jun. 24, 2016 which designated the U.S. and claims benefit of U.S. Provisional Application No. 62/184,050 filed Jun. 24, 2015, the entire contents of each of which are hereby incorporated herein by reference.

STATEMENT REGARDING FEDERALLY SPONSORED RESEARCH OR DEVELOPMENT

None.

FIELD

This example non-limiting technology relates to signal generators, and more particularly to step function signal generators such as pulse current circuits. Still more particularly, the example non-limiting technology herein relates to method and apparatus for producing a step function with a very short rise time by summing a plurality of currents at the different rise times (frequencies).

BACKGROUND AND SUMMARY

A step function changes abruptly from one constant level to another—like a stair on a staircase. Mathematically, a unit step function (a step function that rises one unit) looks like this:

$u(t)=0$ for $t<0$, $u(t)=1$ for $t\geq 0$.

The step function is a useful input signal to measure the performance of circuits and networks. One common use is to measure the unit step response of the circuit or network under test. The step response (response to the step function) of the circuit or network can tell us information about the transfer function of the circuit or network itself. For example, Laplace transform or other mathematics can be used to predict outputs of an idealized circuit or network to an idealized unit step function. By applying a step input signal to actual circuits or networks, the circuit's performance can be measured and compared with the idealized mathematical predictions or otherwise analyzed.

One might think that switching a signal value from low to high is a simple task. But the transition time or "rise time" between low and high levels can be a challenge. In more detail, for test purposes it is often important to pay attention to the so-called "rise time" of the step function—that is, how long the signal takes to transition from the lower level (e.g., 0) to the upper level (e.g., 1). Idealized step functions have an infinitely small (zero) rise time and thus an infinitely steep (vertical on a graph) transition between the lower level and the upper level, but due to current mobility and other factors, there is always some finite delay in the real world. It is nevertheless typically desirable to make step function rise time as short as possible. Another challenge in generating a step function with a short rise is minimizing overshoot and the time the signal takes to settle to a constant level.

Commonly available function generators can generate various different signal functions including step functions with short rise times. For low-power applications, it is easy to generate the step via a set low-power voltage source, a capacitor, and a set of fast switches. Unfortunately, these kinds of signals don't necessarily possess a sufficient quantity of power to be used to test the bandwidth or other characteristics of high power circuits such as high power current sensors that may require 10 amps or more. For high-power applications, it is much more difficult because of overshoot, noise, and long settling time when a high current signal is turned on and off.

Typically, the fastest way to characterize the frequency response of a device is to expose it to an impulse or the closest approximation to the Dirac delta function. The narrower the full-width half-maximum (FWHM) of the impulse in the time domain, the wider the bandwidth it represents in the frequency domain, as the Fourier transform of the Dirac delta function is a constant across all frequencies. However, some devices or sensors are too slow to respond to this function, or if this function is produced with high-current it may not be narrow enough. In that case, it is more advantageous to realize that the Dirac delta is the derivative of the step function and expose the device or sensor to a step-function instead. Just as the Fourier transform of the derivative of the step function results in the frequency response of the impulse, the Fourier transform of the derivative of the output of the device or sensor results in the frequency response of the impulse response.

To test the bandwidth of a high power current sensor or other power circuit, it is helpful to generate a high current step-function with a fast enough rise time to generate a wide bandwidth in the frequency domain through the derivative and the subsequent Fourier transform of the resulting delta function. When a high power source is switched without appropriate signal conditioning, the result may not have a fast enough rise time, there is usually overshoot of the current, and the signal may not stabilize quickly enough to resemble a step function. The resulting signal might in fact resemble more of a ramp function with overshoot than a step function. In addition, since the step function maintains a certain current level for an amount of time specified by the design of the step function, it is also possible to obtain the steady-state response of the sensor or device under test. In summary, it enables the measurement of the frequency response and the steady-state response in one measurement.

Without a high-power step-function generator, the frequency response characterization of high-current sensors or other circuits or components may take substantially longer time to complete or might not be possible to complete, if the sensor or device is not sensitive enough to detect the lower current signal. For a basic frequency bandwidth characterization of a device, the device could be exposed to sinusoidal signals at the desired frequency(ies), typically beginning with zero until the maximum frequency of the test, and for each input signal frequency the output of the device is recorded. Finally the gain could be calculated at each frequency, resulting in the frequency response.

A faster way to perform such a measurement is to realize that the theoretically weighted sum of several sinusoids results in a step function, where the rise time depends on the frequency bandwidth (i.e., the number of frequencies) of the sum of the sinusoidal signals. The derivative with respect to time of the step function results in an impulse function. If a system is exposed to an impulse, the Fourier transform of the output is the frequency response. Alternatively, the frequency response is obtained by exposing the device to a step function comprising a large enough bandwidth of frequencies and calculating the Fourier transform of the derivative of the step-response with respect to time.

DETAILED DESCRIPTION OF EXAMPLE NON-LIMITING EMBODIMENTS

The example non-limiting embodiments herein provide method and apparatus to produce a step function with a rise time on the order of 2.5 ns or less that reaches steady state, by implementing a system that sums a number of currents at the different rise times (frequencies) to generate the step function. However, if for a given application a longer rise time is desirable, the method and apparatus provided here may also be used to design a step-function of arbitrary or predetermined (e.g., desired) rise time and current level. The system also includes a passive output filter, composed of low resistance, inductance and very low capacitance to mitigate overshoot and high frequency noise.

To practically realize the sum of frequencies, a capacitor bank with different types of capacitors composed of different materials with different time constants and values is placed at the input to store the current/power. At the output, very small filter capacitors are used to filter the high-frequency noise. Between the input and output, the resistance and inductance of the path is carefully considered. To protect the primary power supply (for example, a battery or a benchtop power supply), Schottky diodes which can source sufficient current are employed. With this design we can also vary the current level between 0 and the desired maximum current, while maintaining the desired waveform.

Figure 1:
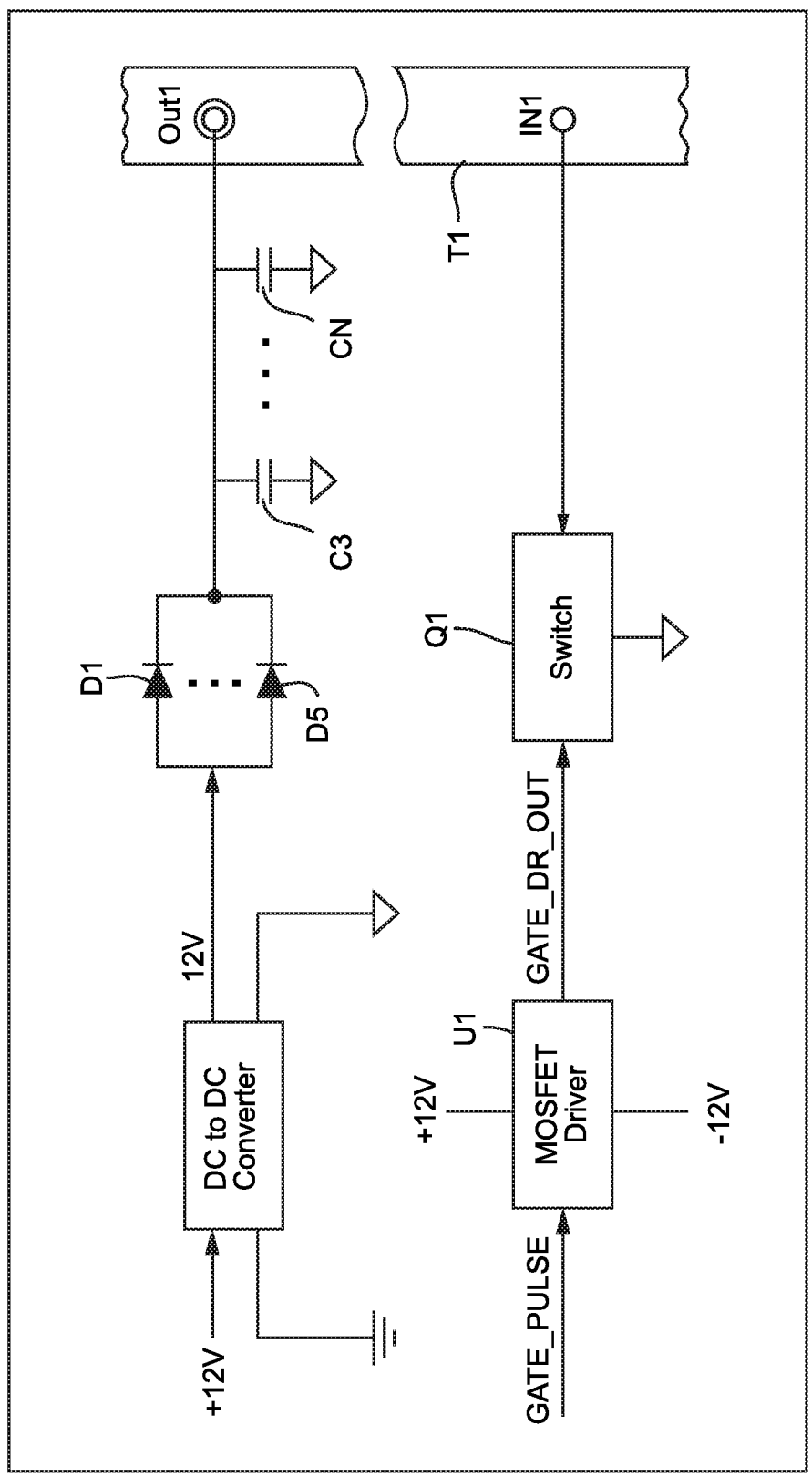
FIG. 1 shows a block diagram of an example non-limiting embodiment of a high current low rise time step function generating circuit.

An illustrative non-limiting example circuit is shown in FIG. 1. In this example, input power (+12 VDC) is applied to a DC-to-DC converter that produces double rail (+12 VDC, −12 VDC) supply voltages. The +12 VDC supply voltage is supplied via a bank of high current Schottky diodes D1-D5 to a capacitor bank C3-CN. Capacitor bank C3-CN comprises a variety of different capacitors with different characteristics and time constants. The resulting conditioned power is applied via an "OUT1" connection to one part or end of a current sensor trace T or other component under test. Another part or end of the current sensor trace T or other component under test is connected via an "IN1" connection to a high power MOSFET switching transistor Q1. The switching transistor Q1 switches in response to a gate drive signal supplied by a MOSFET driver U1, which in turn is triggered by a gating pulse produced by a control source.

When MOSFET switch Q1 is in a high impedance state, the capacitor bank C3-CN charges with current the Schottky diodes D1-D5 supply. When switch Q1 switches to a low impedance (current sink) state, the capacitor bank C3-CN discharges at high current through the trace and the switch to ground. The capacitor bank C3-CN is structured and configured so that some capacitive elements discharge more rapidly than others such that the resulting summed signal waveform approaches a step function.

High-power switch Q1 is controlled by MOSFET driver U1 to discharge the power in the capacitor bank C3-CN through copper trace T, which in one embodiment is externally connected at connections labeled "IN1" and "OUT1" in the schematic. The high-power switch Q1 may be controlled for example via "GATE_PULSE" by a microcontroller executing software instructions stored in a non-transitory storage device, by a normal low-power signal generator pulse, or by other means. The low-power signal generator or microcontroller or similar device produces a square pulse "GATE_PULSE"signal, which turns on the MOSFET driver for a desired (e.g., controlled) duration.

Figure 1A:
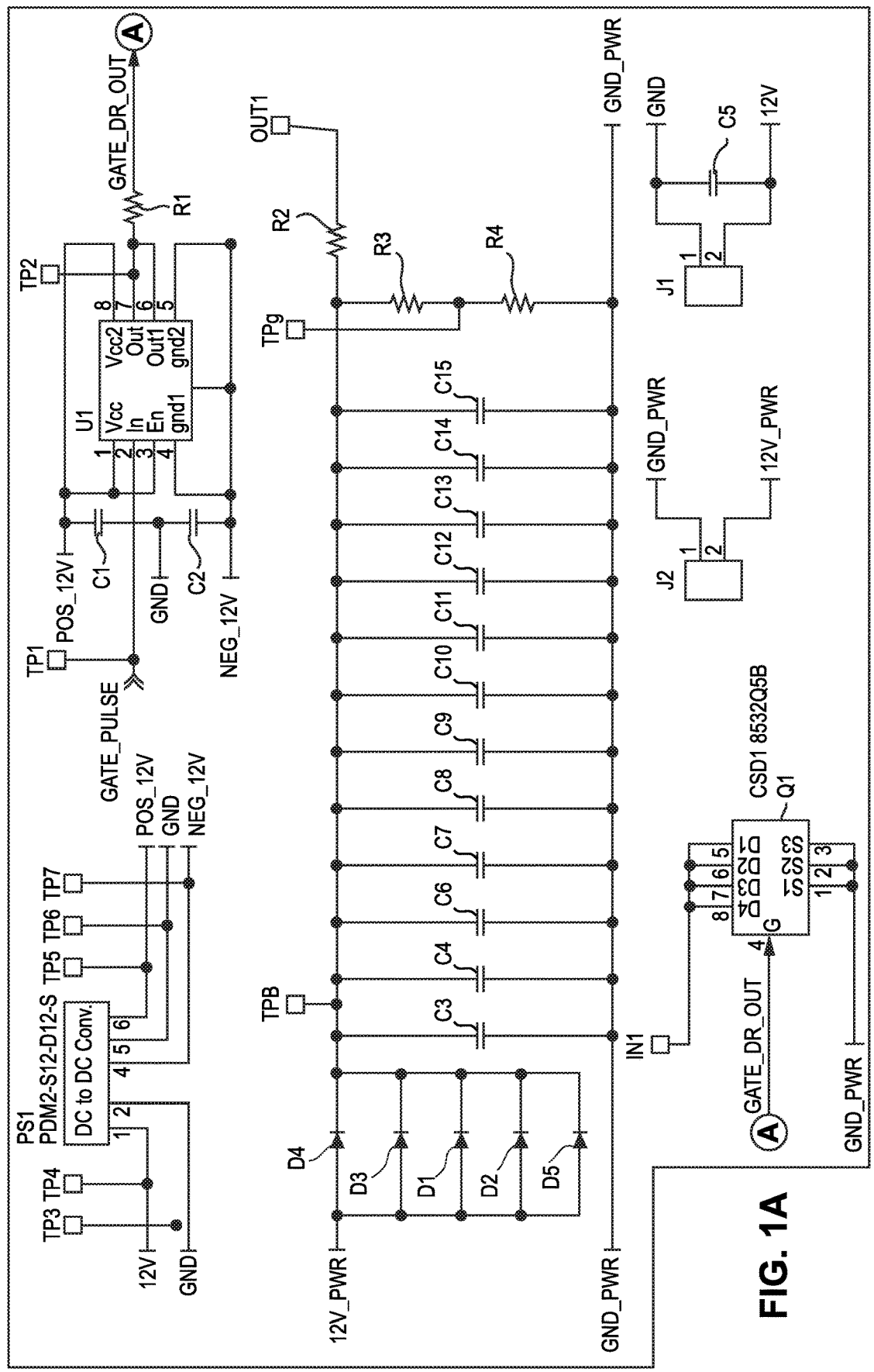
FIG. 1A shows an example non-limiting schematic circuit diagram of a step function generating circuit providing a step-current pulse with <=2.5 ns rise time. A copper trace may be connected between the connections labeled "out1" and "in1" to take the step function near or to the device to be tested.

FIG. 1A shows an example non-limiting schematic circuit diagram of the FIG. 1 generator. In this example, the DC to DC converter may comprise a monolithic PDM2-S Series 2 W, 1:1 Input Range, Single/Dual Unregulated Output, 6 Pin SIP, 1500 VDC Isolation, High Temp Range, DC-DC Converter manufactured by CUI Inc. The POS_12V power is supplied via 1V 10 Amp Schottky diodes D1-D5 to capacitor bank C3-C15. Schottky diodes D1-D5 have low forward voltage and higher switching speeds.

The capacitor bank C3-C15 in this particular non-limiting example comprises 12 discrete capacitors with the following non-limiting characteristics:

| C3 | 0.1 μF Mica |
|---|---|
| C4 | 0.1 μF Mica |
| C5 | Extra or not used |
| C6 | 0.1 μF Mica |
| C7 | 47 μF Electrolytic |
| C8 | 100 μF Electrolytic |
| C9 | 100 μF Electrolytic |
| C10 | 200 μF Electrolytic |

-continued

| | |
|---|---|
| C11 | 1 µF film |
| C12 | 2.24 µF film |
| C13 | 2.24 µF film |
| C14 | Extra |
| C15 | Extra |

Figure 5:
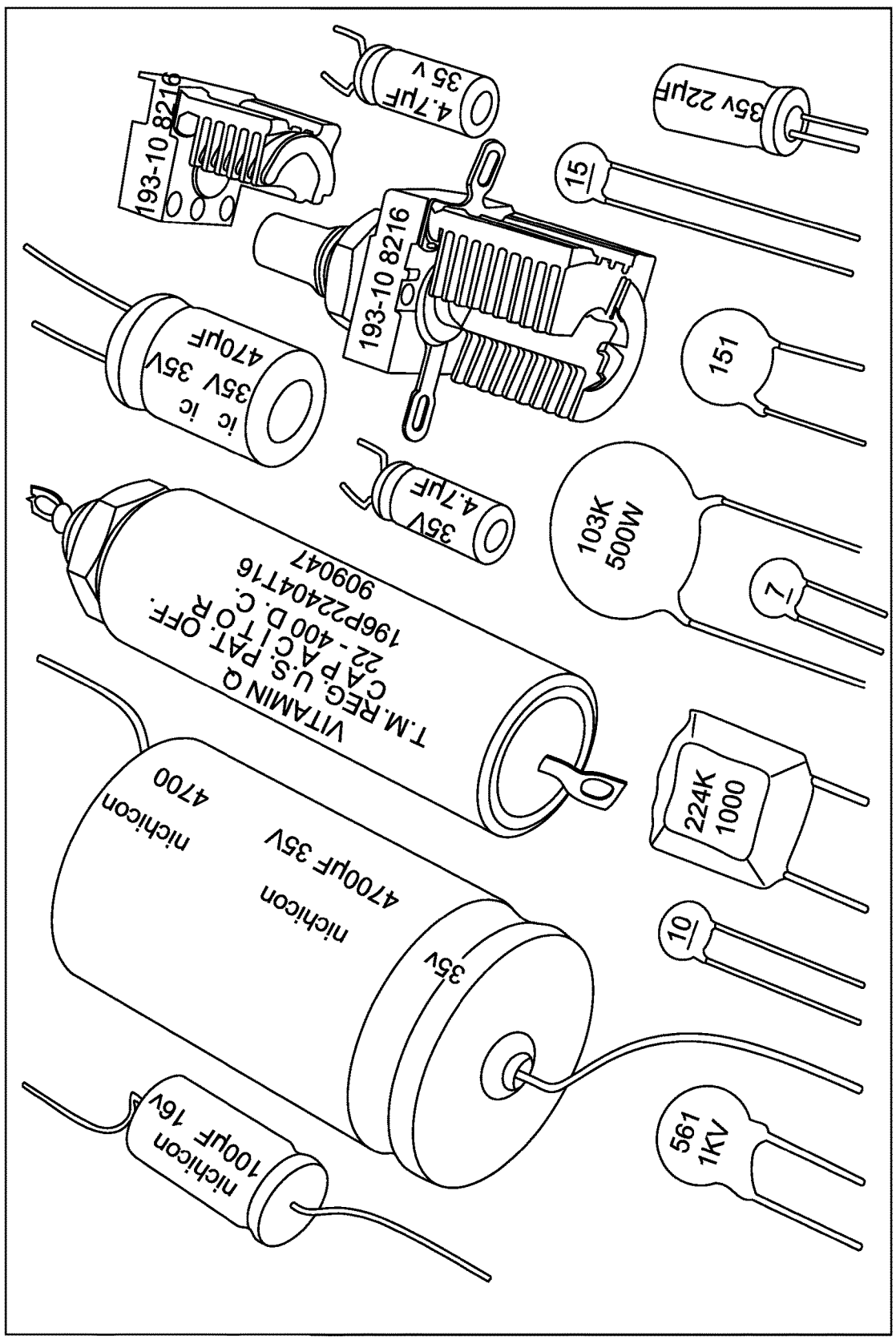
FIG. 5 shows a variety of capacitors that can be used to realize the FIG. 1A capacitor bank.

As can be seen, this particular non-limiting configuration comprises three different capacitor types (mica, electrolytic, film). Other capacitor types such as ceramic, polyethylene, air core, oil, Tantalum or other (see FIG. 5) are possible. Film capacitors generally are able to supply high surge currents, electrolytics are slow but stable and able to supply large quantities of current, and mica capacitors discharge small amounts of current rapidly.

The non-limiting capacitor bank also comprises several different capacitor values (0.1, 1, 2.24, 47, 100 and 200 µF). In the example shown, the capacitors are all being used at relatively low voltage (e.g., 12 VDC) that are well below their maximum ratings (which could be 1000 or 1500 VDC for film or mica capacitors). By initiating the discharge all at the same time of different capacitor types with different values that supply current at slightly different times and in different amounts and for different durations, a sequence of discharging current pulses result. This sequence of discharging current pulses are summed together to design a step-function or square wave function in the time domain in this non-limiting illustrative embodiment. If a heterogeneous collection of a plethora of different types and values of discharging capacitors are properly selected, the overall summed discharge resembles a sinc function pulse in the frequency domain, i.e., the Fourier transform of the rectangular function in the time domain. The effect is similar to superposition of cosines to create a square wave.

Although the capacitor bank discharge is initiated at the same time, all of the capacitors do not discharge exactly at the same time. Since these capacitors are positioned in parallel to each other and cannot be plugged directly into the same holes, there is a trace connecting one end of each capacitor, for example, the positive end, if the purpose of the capacitor bank is to generate a rising edge. Any trace connecting two components has inductance and causes a delay depending on the geometry of the trace. If a high-speed pulse capacitor is placed further away from the output, the trace connecting it to the output will provide a delay, via its inductance, that will also help dampen the overshoot and help balance its speed with the other slower capacitors. In addition, if three of the same type and value capacitor are placed in parallel, they will not necessarily discharge exactly at the same time unless the lead length added to the trace length and electrical properties between the body of the capacitor and the output are identical. By purposely creating a short distance between similar and different types of capacitors via the connecting traces and designing the geometry of the connecting traces with specific geometries, it is possible to delay the discharge timing of some capacitors relative to others and thus gain more precise control over the timing the sequential discharge of each capacitor in the bank. As an alternative to traces, small inductive elements in series or other switches that are sequentially turned on may be used as well.

While empirical experimentation can be used to determine an appropriate mixture of capacitor types and values, a more rigorous mathematical approach is possible that models the capacitor bank with equations that describe the peak discharge current of each capacitor. To achieve a sufficiently high peak discharge value at a particular time after overall discharge has been initiated, it is possible to have redundant capacitors of the same type and value (e.g., 3 identical mica capacitors of all the same value, 2 identical 100 µF electrolytics, 2 identical 2.24 µF thin film capacitors, etc.). Generally speaking, the individual discharge current pulses get broader as they occur later and later in the discharge sequence.

A rough visualization might be to imagine a line of people some of whom are taller and some of whom are shorter. First in line might be a short person who stands up first. The next person in line to stand up might be a person of medium height but who is relatively wide. Next might be a very tall but skinny person. Next could be another medium height person. In this analogy, each person who stands up in line represents a current discharge from a different type and/or value of capacitor. The resulting summed envelope of superimposed multiple capacitive discharges provides a sustained current discharge for a desired duration.

FIG. 1A shows additional resistors R2, R3, R4 connected as an output filter. The purpose of this resistive network is three-fold: (1) it is desirable to have resistors in parallel so that the capacitors can discharge safely in the event that the circuit is turned off before the capacitor bank is discharged, (2) to provide an alternative way to monitor the charge and discharge rate of the capacitor bank without taking away power from the output, and (3) when combined with very small capacitance, the resistive network forms a filter which can reduce high frequency noise. Given the high current application of the non-limiting embodiment, the series-connected resistor R2 has a small resistance value to reduce heat dissipation but also provides an output current limiting function that protects the capacitor bank. It also permits the measurement of exactly how much current over time is discharged from the capacitor bank by measuring the voltage across this resistor.

Figure 8:
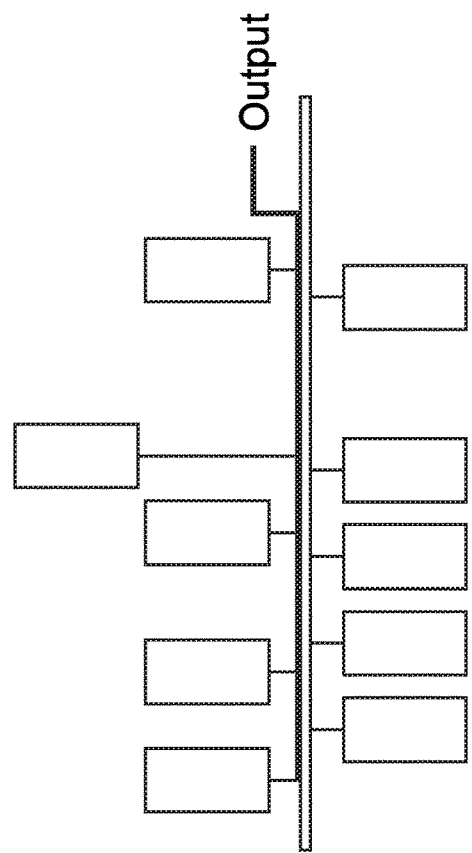
FIG. 8 shows an example non-limiting capacitor bank layout.
Figure 9:
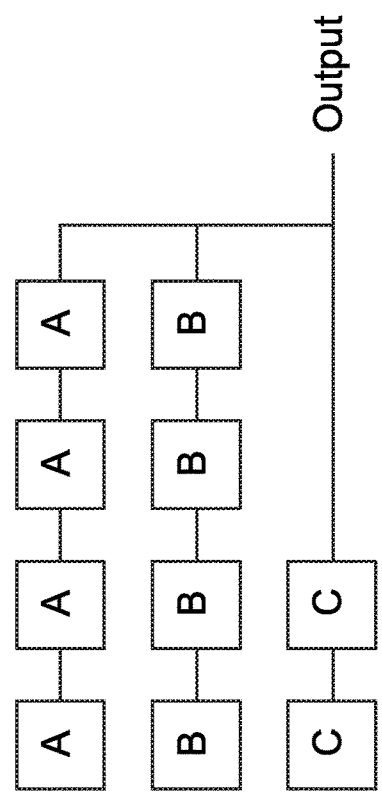
FIG. 9 shows an additional example non-limiting capacitor bank layout.
Figure 6:
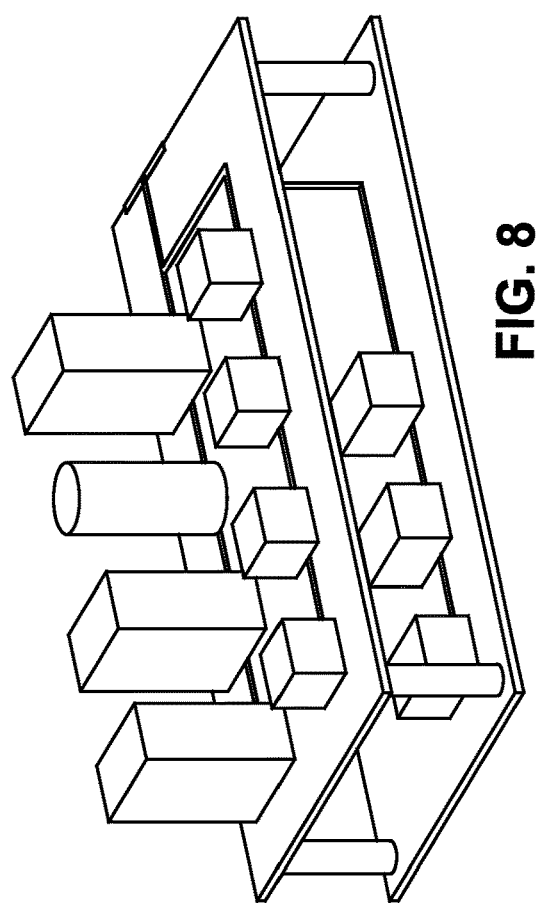
FIG. 6 shows an example non-limiting capacitor bank connection.
Figure 7:
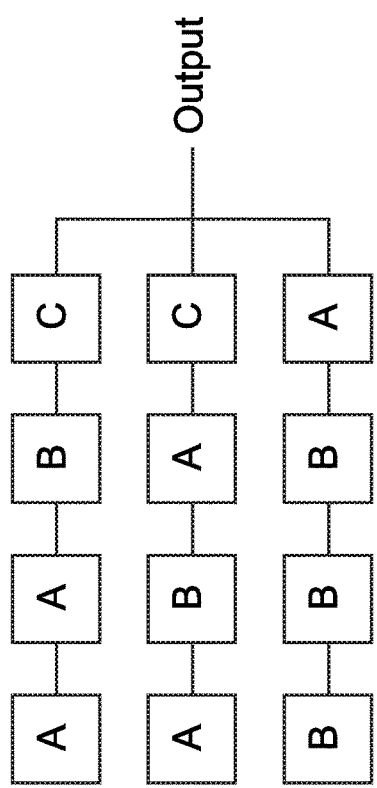
FIG. 7 shows an additional example non-limiting capacitor bank connection.
Figure 10:
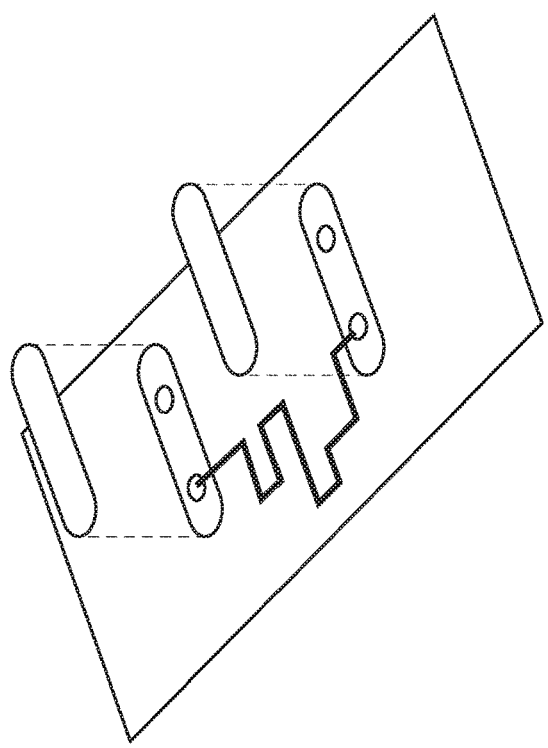
FIG. 10 shows an example non-limiting meandering capacitor connection.

FIG. 1A shows a single bank of capacitors C3-C4, C6-C15 where all of the capacitors are connected in parallel. However, the effects described above may also be achieved by using a plurality of capacitor banks which are connected in parallel, as shown in FIGS. 6 & 7. Each capacitor bank may consist of a single type of capacitor with similar or different values. Alternatively, the capacitor bank may comprise a variety of different types of capacitors. Or, a combination of both types of capacitor banks may be used. In these figures, the letters "A", "B" and "C" represent different capacitor types. In FIG. 6, the top bank comprises four capacitors of type A, A, B C, whereas the middle bank comprises four capacitors of types A, B, A, C and the bottom bank comprises four capacitors of types B, B, B, A, with the three banks connected in parallel. FIG. 7 shows how different banks can have different numbers of capacitors, some banks can comprise homogeneous capacitor types (e.g, the FIG. 7 top bank is made up of all "A" type capacitors), and other banks can comprise heterogeneous types (e.g., see FIG. 6). Different banks can have different quantities of capacitors or the same quantities of capacitors. Banks can be switched in and out as desired for programming different output durations and other characteristics. All may connected in parallel by one or more switches. For some applications, where space is constrained, it may be advantageous to connect the capacitor banks in parallel vertically, horizontally, or a combination of both, as FIG. 8 shows. An individual capacitor bank may have components on the top and bottom of a single printed circuit board (PCB) in order to put them closer together, as FIG. 9 illustrates, or they may be disposed on different PCBs (as FIG. 8 shows) with spacers or other structures connecting the boards. The boards can be stacked, disposed side by side, or provided in other orientations relative to one another. In the FIG. 9 embodiment, some of the capacitors have longer leads than others, which can introduce an adjustable amount of inductance (depending on lead length) and thus further delay (as well as to allow more capacitors to fit into a given real estate, with some being "high rise" units that tower over and horizontally overlap "low rise" units. In FIG. 9, the capacitors on opposing sides of the board could be the same or different types. FIG. 10 shows the use of a meandering or other configured PCB trace to provide adjustable (add or subtract) inductance/delay for connection of particular capacitors.

The capacitor banks may also be integrated into one component or a new device. This device or multiplicity of them could then be connected to the power source and switch so that it would discharge to generate the desired waveform. In some implementations, it may be possible to use capacitances provided by capacitive-providing circuits such as certain types of transistors instead of lumped capacitors for some or all of the capacitors in the bank(s).

Figure 2B:
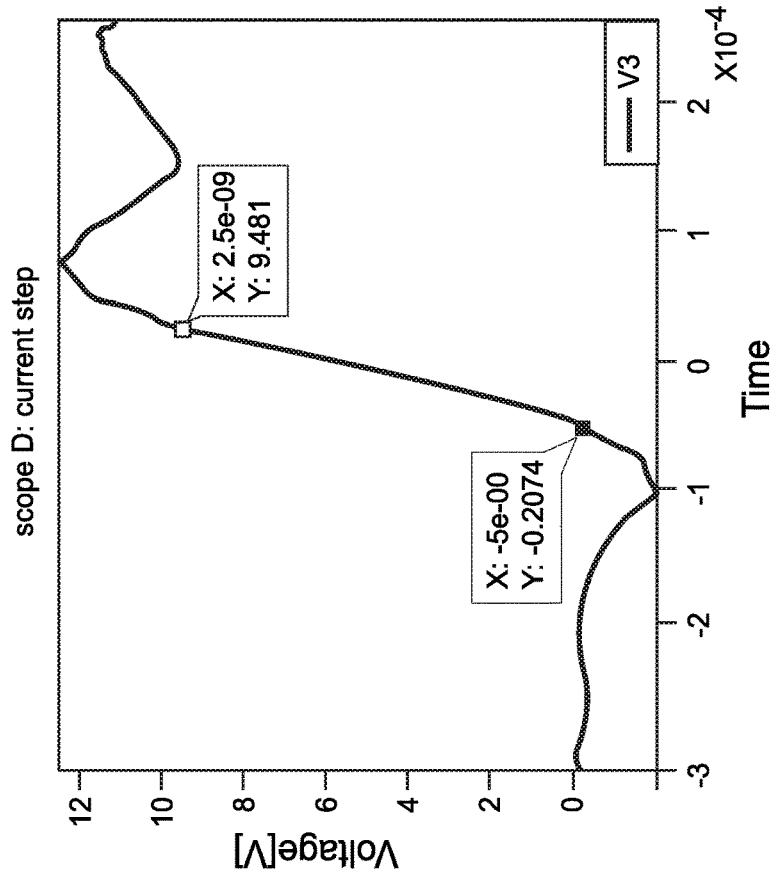
FIGS. 2A, 2B illustrate an example non-limiting step-current generated by the FIG. 1A circuit. On the left (FIG. 2A), the step current rises fast and settles with minimal noise and fast settling time. The image on the right (FIG. 2B) zooms in to the rise time portion to show the time interval during which the current rises.
Figure 2A:
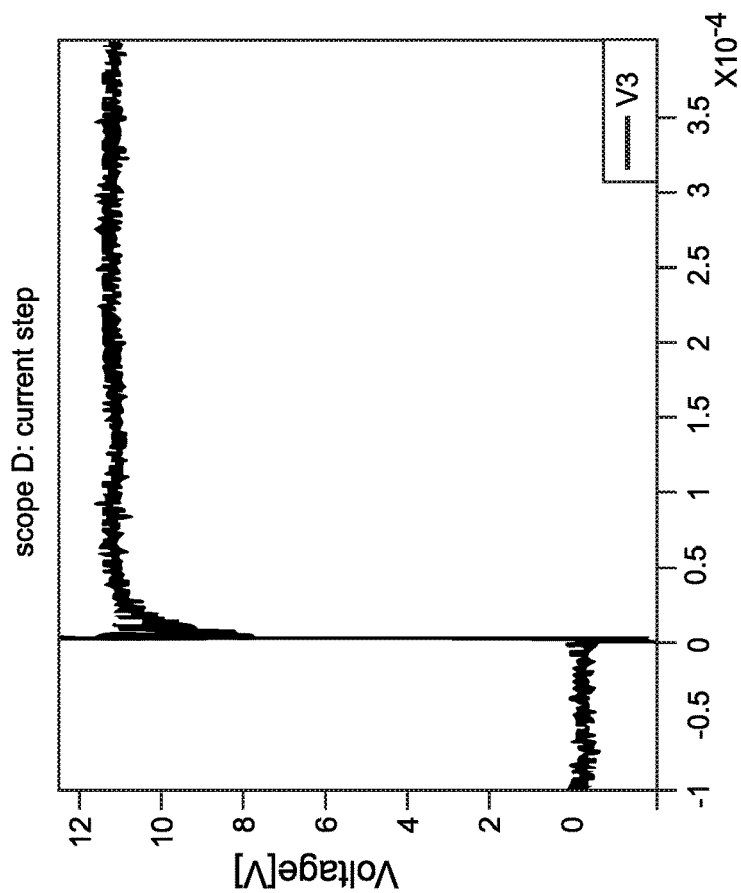

Example non-limiting output waveforms are shown in FIG. 2A, 2B. The left image of FIG. 2A shows a typical high current step-function. The right image of FIG. 2B zooms in to show the rise time, which in this particular data capture is extremely fast, ~7.5 ns. Higher speeds are possible using the same circuit.

Figure 3A:
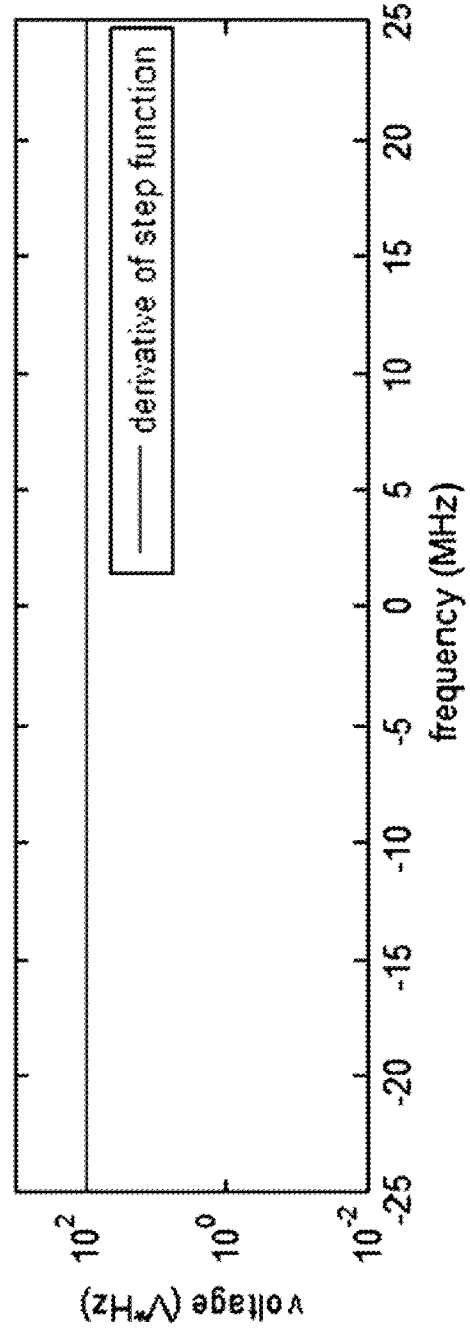
FIGS. 3A, 3B present magnitude (top) and phase (bottom), respectively of the frequency response of the derivative of the step function. Ideally, the magnitude should be constant across all frequencies. The phase repeats depending on the sampling frequency (1/2.5 ns).
Figure 3B:
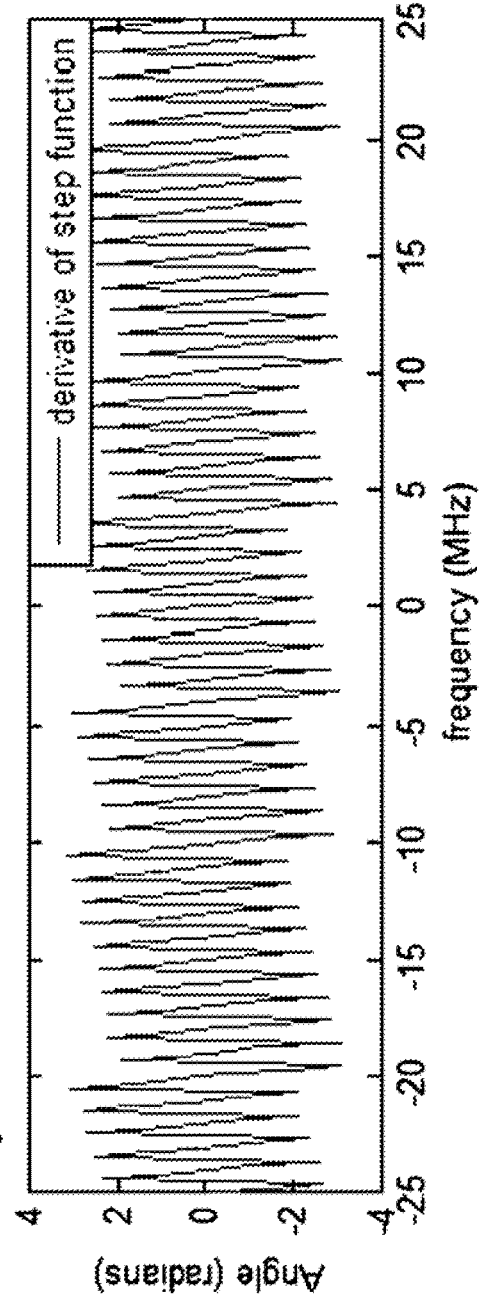
Figure 4:
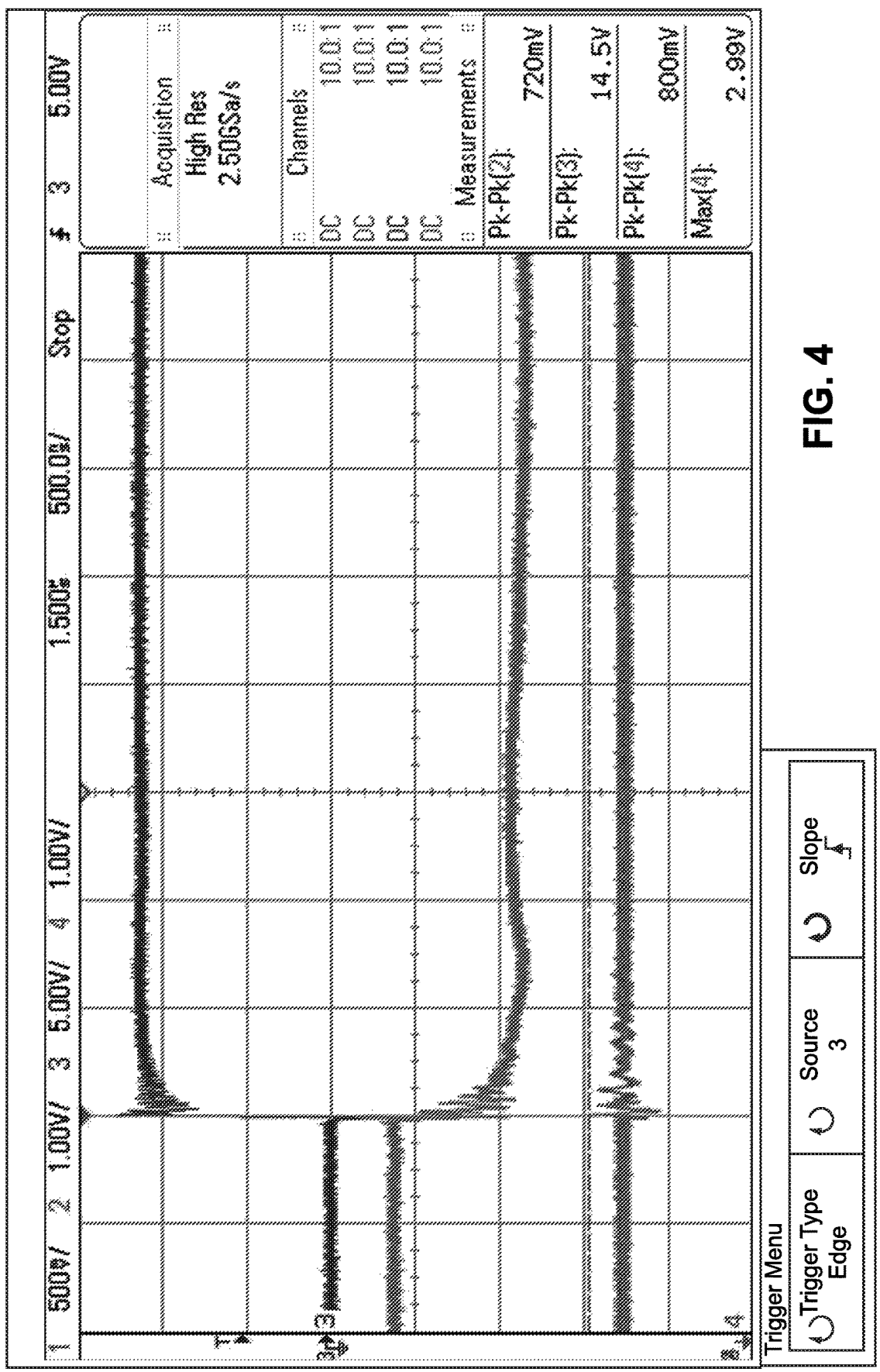
FIG. 4 shows an example non-limiting screenshot from an oscilloscope trace of the step-function (probe 3). The other curves comprise the sensor response triggered by the step-function.

FIGS. 3A, 3B show the corresponding magnitude and phase of the frequency response of the derivative of the step function. In the time domain, the derivative of a step function is a delta function. The magnitude of the Fourier transform of the delta function is constant over all frequencies. For the given frequency range the magnitude of the derivative of our step function is also constant. FIG. 4 shows original data collected from an oscilloscope. The probe 3 trace recorded a voltage of 10V across the low inductance 1Ω resistor, which implies that the current was ~10 A. This kind of circuit could be applied as a flexible stand-alone system if it is controlled by a signal generator such as microprocessor to test the frequency response of non-contact magnetic field-, current sensors, current transducers, Rogowski coils, inductors and similar devices. It could also be packaged into a high-power signal generator which has other types of signals built in, such as sinusoids or triangle waves, etc. A system that generates an adjustable high-current fast rise time step response is helpful to quickly test current sensors and similar components that will be integrated in the smart energy grid. First of all it can be used to test the ability of such a component to detect the current. However, it can also be used to test the immunity of such a component to high currents which change quickly, generating a band of high frequencies (EMI). For example, it could also be used to test EMI shields, absorbers, and concentrators or for rapid repetitive current testing of many components. Typically, semiconductor wafers and devices are subject to fast high current pulse discharge as part of their quality control testing.

Applications other than testing are possible. The embodiment is useful for any application that benefits from a high current discharge step function with a short rise time. For example, it could be used to extend the range of a low power, high current radar pulse generator for the same power. It could also be used for pulsed LED or other lighting. It could also be used to supplement or redirect power towards certain devices or power lines quickly.

Figure 11:
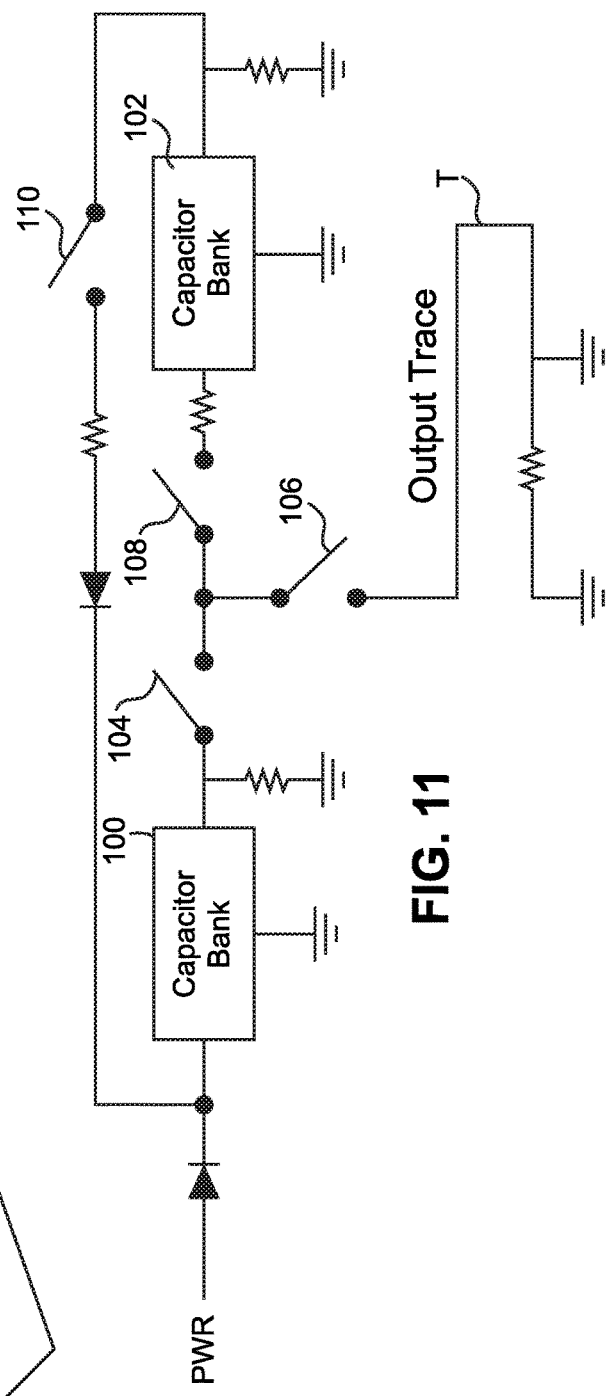
FIG. 11 shows an example further non-limiting circuit providing charging and discharging.
Figure 12:
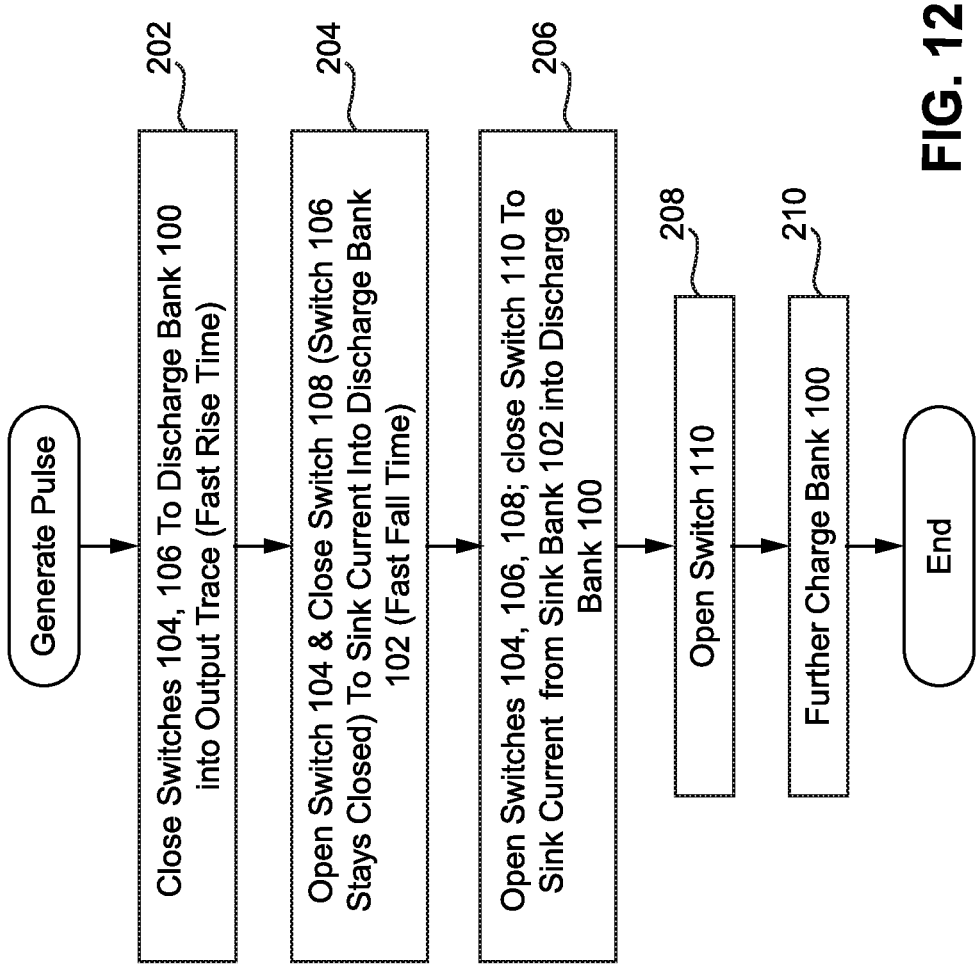
FIG. 12 shows an example non-limiting flowchart of program control steps for controlling the FIG. 11 circuit.

In another non-limiting illustrative embodiment, if the order of the capacitor bank and the switch were reversed, such that the purpose were to charge the capacitor bank quickly, this capacitor bank could also be used to sink power quickly from another charged capacitor bank and then output could be returned to a zero level just as quickly to produce a short fall time. Additionally, if a capacitor bank with a fast rise time and a series of switches were combined with an empty capacitor bank with similar properties connected via another switch, it is also possible to create a more precise square wave by alternating the discharge of the current through the trace and then charging the capacitor bank at the desired duty cycle by careful control of the switches. FIG. 11 shows such a configuration and FIG. 12 shows a flowchart of steps performed by computer instructions executed on a processor or other controller to control the FIG. 11 circuit. In this example embodiment, capacitor bank 100 comprises an initially full bank, and capacitor bank 102 comprises an initially empty bank used as a current sink. Power ("PWP") is applied to bank 100 to initially charge it. Switches 104, 106 are then closed at the same time to send current to the output trace T, creating a fast rise time (FIG. 12 block 202). To create a fast fall time, switch 104 is opened, switch 108 is closed, and switch 106 remains closed, to sink current into the discharged capacitor bank 102 (FIG. 12 block 204). The compositions and characteristics of banks 100, 102 can be the same or different, e.g., in order to adjust or tailor the rise time characteristics relative to the fall time characteristics. A further one-way current path from bank 102 to bank 100 via switch 110 can be used to discharge the sink capacitor bank 102 into the source capacitor bank 100, thereby conserving energy (FIG. 12 block 206). After discharge, switch 110 is then opened so the discharge bank 100 can recharge (FIG. 12, blocks 208, 210). In summary, any capacitor bank or circuit that can be used to source current/energy, can also be used to sink current/energy. Such a capacitor bank could also be used as a very wideband filter.

The example non-limiting technology herein has been described in the above detailed description, in which some, but not all embodiments are described. Indeed, this example non-limiting technology may be embodied in many different forms and should not be construed as limited to the embodiments set forth herein; rather, these embodiments are provided so that this disclosure will satisfy applicable legal requirements.

The terminology used herein is for the purpose of describing particular embodiments only and is not intended to be limiting. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

It will be understood that a number of techniques and steps have been disclosed. Each of these has individual benefit and each can also be used in conjunction with one or more, or in some cases all, of the other disclosed techniques. Accordingly, for the sake of clarity, this description has refrained from repeating every possible combination of the individual steps in an unnecessary fashion. Nevertheless, the specification and claims should be read with the understanding that such combinations are entirely within the scope of the example non-limiting technology herein.

We claim:

1. A method of producing a high current output with a designed rise and/or fall time comprising:
   actuating a switch to charge or discharge a capacitance,
   structuring the capacitance to provide a capacitor bank comprising at least a first capacitor and a second capacitor, the first capacitor being made of a different material than the second capacitor, the capacitors in the capacitor bank being connected to a current summing node, and
   at the current summing node, summing current outputs provided by the capacitors of the capacitor bank to deliver a summed high current output exhibiting a designed rise and/or fall time that is dependent on the values and materials of the capacitors in the capacitor bank,
   wherein the first and second capacitors provide first and second sinusoids, respectively, each of the first and second sinusoids represented in a discharge pulse of a corresponding capacitance, the discharge pulses of the capacitors in the capacitor bank providing different bandwidths so that when the discharge pulses of different bandwidths are summed they approximately result in a step function, wherein rise time of the step function depends on the different bandwidths, and the number and selection of different materials and/or sizes of the capacitors in the capacitor bank determines the precision with which the step function is approximated.

2. The method of claim 1 wherein at least some of the capacitors have different values.

3. The method of claim 1, wherein the capacitor bank includes some capacitors that are of the same material and have the same value.

4. The method of claim 1, further including selecting the values and materials of the capacitors in the capacitor bank to provide a desired shape of current output.

5. A method of producing a high current output with a designed rise and/or fall time comprising:
   actuating a switch to charge or discharge a capacitance,
   structuring the capacitance to provide a capacitor bank comprising at least a first capacitor and a second capacitor, the first capacitor being made of a different material than the second capacitor, the capacitors in the capacitor bank being connected to a current summing node, and
   at the current summing node, summing current outputs provided by the capacitors of the capacitor bank to deliver a summed high current output exhibiting a designed rise and/or fall time that is dependent on the values and materials of the capacitors in the capacitor bank,
   further comprising filtering the current output with a passive output filter composed of low resistance, inductance and very low capacitance to mitigate overshoot and high frequency noise.

6. A method of producing a high current output with a designed rise and/or fall time comprising:
   actuating a switch to charge or discharge a capacitance,
   structuring the capacitance to provide a capacitor bank comprising at least a first capacitor and a second capacitor, the first capacitor being made of a different material than the second capacitor, the capacitors in the capacitor bank being connected to a current summing node, and
   at the current summing node, summing current outputs provided by the capacitors of the capacitor bank to deliver a summed high current output exhibiting a designed rise and/or fall time that is dependent on the values and materials of the capacitors in the capacitor bank; and
   wherein the connections of the capacitors in the capacitor bank to the summing node are configured to provide different inductances and associated charge or discharge delays.

7. A system for producing a high current output with fast rise time comprising:
   a capacitance; and
   a switch connected to selectively charge and discharge the capacitance,
   the capacitance being structured as a capacitor bank providing capacitors of different materials connected to a summing node, and
   the summing node summing current outputs provided by the capacitors in the capacitor bank to deliver a shaped high current output,
   further comprising a passive output filter comprising a low resistance, inductance and very low capacitance to mitigate overshoot and high frequency noise.

8. The system of claim 7 wherein at least some of the capacitors have different values.

9. The system of claim 7, wherein the capacitors include some capacitors that are the same material and have the same value.

10. The system of claim 7, wherein the materials and values of the capacitors are selected to provide a desired shape of current output.

11. The system of claim 7, wherein the system is provided as a flexible stand-alone system controlled by a signal generator to test the frequency response of devices.

12. The system of claim 7, wherein the system is packaged into a high-power signal generator which has other types of signal waveforms built in.

13. The system of claim 7, wherein the capacitors are disposed on the same or different substrates, are disposed on the same or different sides of a substrate, are connected into one or more than one bank, and have the same or different length leads.

14. A system for producing a high current output with fast rise time comprising:
   a capacitance; and
   a switch connected to selectively charge and discharge the capacitance, the capacitance being structured as a capacitor bank providing capacitors of different materials connected to a summing node, and
   the summing node summing current outputs provided by the capacitors in the capacitor bank to deliver a shaped high current output,
   wherein the capacitors provide a plurality of sinusoids, each of the plurality of sinusoids being represented in a discharge pulse of a corresponding capacitance, the discharge pulses providing different bandwidths so that when the discharge pulses of different bandwidths are summed they approximately result in a step function, wherein the rise time of the step function depends on the different bandwidths and the selection of numbers, materials and/or sizes of capacitors determines the precision with which the step function is approximated.

15. A system for producing a high current output with fast rise time comprising:
a capacitance; and
a switch connected to selectively charge and discharge the capacitance,
the capacitance being structured as a capacitor bank providing capacitors of different materials connected to a summing node, and
the summing node summing current outputs provided by the capacitors in the capacitor bank to deliver a shaped high current output
wherein at least some of the capacitors are connected via meandering traces that introduce adjustable amounts of inductance and associated charge/discharge delay.

16. A system for producing a high current output with designed transition time comprising:
a capacitor bank; and
a switch connected to selectively charge and discharge the capacitor bank,
the capacitor bank comprising different capacitors of different materials connected to a summing node, the different capacitors of different materials providing corresponding discharge current pulses of different widths,
wherein connections between the different capacitors introduce inductances that delay the discharge current pulses of different widths,
the summing node summing the delayed discharge current pulses to deliver a high current output resembling a step function with rapid rise time and low overshoot.

17. The system of claim 16 wherein the different capacitors each comprise capacitor banks.

18. The system of claim 16 wherein the different capacitors have different capacitance values.

* * * * *